United States Patent
Brunco

(10) Patent No.: US 9,299,809 B2
(45) Date of Patent: Mar. 29, 2016

(54) METHODS OF FORMING FINS FOR A FINFET DEVICE WHEREIN THE FINS HAVE A HIGH GERMANIUM CONTENT

(71) Applicant: GLOBALFOUNDRIES Inc., Grand Cayman (KY)

(72) Inventor: David P. Brunco, Tervuren (BE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 50 days.

(21) Appl. No.: 13/716,758

(22) Filed: Dec. 17, 2012

(65) Prior Publication Data

US 2014/0170839 A1 Jun. 19, 2014

(51) Int. Cl.
*H01L 29/66* (2006.01)
*H01L 29/165* (2006.01)

(52) U.S. Cl.
CPC .... *H01L 29/66795* (2013.01); *H01L 29/66818* (2013.01); *H01L 29/165* (2013.01)

(58) Field of Classification Search
CPC ............... H01L 21/31658; H01L 21/823821; H01L 21/823831; H01L 27/0886; H01L 27/0924; H01L 29/66795; H01L 29/66818; H01L 29/7842; H01L 29/7843; H01L 29/785; H01L 29/7851; H01L 21/823431; H01L 21/845; H01L 27/1211; H01L 29/41791
USPC .................... 257/616; 438/157, 176, 479, 478
See application file for complete search history.

(56) References Cited

U.S. PATENT DOCUMENTS

| | | | |
|---|---|---|---|
| 2004/0262687 A1* | 12/2004 | Jung et al. ..................... 257/347 |
| 2005/0255643 A1* | 11/2005 | Ahn et al. ..................... 438/197 |
| 2007/0207598 A1 | 9/2007 | Damlencourt et al. |
| 2007/0221956 A1* | 9/2007 | Inaba ............................. 257/197 |
| 2007/0241399 A1* | 10/2007 | Irisawa et al. ................. 257/347 |
| 2008/0001171 A1* | 1/2008 | Tezuka et al. ................. 257/191 |
| 2008/0073667 A1* | 3/2008 | Lochtefeld .................... 257/190 |
| 2008/0237575 A1* | 10/2008 | Jin et al. .......................... 257/19 |
| 2009/0081854 A1* | 3/2009 | Kim et al. ...................... 438/478 |
| 2009/0085027 A1* | 4/2009 | Jin et al. .......................... 257/24 |
| 2009/0090934 A1* | 4/2009 | Tezuka et al. ................. 257/190 |
| 2010/0144121 A1* | 6/2010 | Chang et al. ................... 438/478 |
| 2010/0164102 A1* | 7/2010 | Rachmady et al. ........... 257/741 |
| 2011/0147811 A1 | 6/2011 | Kavalieros et al. |

(Continued)

OTHER PUBLICATIONS

Oh et al., "Integration of GaAs epitaxial layer to Si-based substrate using Ge condensation and low-temperature migration enhanced epitaxy techniques", Sep. 2007, J. Appl. Phys. 102, pp. 054306-1-054306-6.*

(Continued)

*Primary Examiner* — Khiem D Nguyen
*Assistant Examiner* — Pauline Vu
(74) *Attorney, Agent, or Firm* — Amerson Law Firm, PLLC

(57) ABSTRACT

One illustrative method disclosed herein includes forming a silicon/germanium fin in a layer of insulating material, wherein the fin has a first germanium concentration, recessing an upper surface of the layer of insulating material so as to expose a portion of the fin, performing an oxidation process so as to oxidize at least a portion of the fin and form a region in the exposed portion of the fin that has a second germanium concentration that is greater than the first germanium concentration, removing the oxide materials from the fin that was formed during the oxidation process and forming a gate structure that is positioned around at least the region having the second germanium concentration.

33 Claims, 12 Drawing Sheets

(56) References Cited

U.S. PATENT DOCUMENTS

2011/0193178 A1* 8/2011 Chang et al. .................. 257/408
2012/0319211 A1* 12/2012 van Dal et al. ................ 257/401
2013/0113026 A1* 5/2013 Huang et al. .................. 257/288

OTHER PUBLICATIONS

Liow et al., "Investigation of silicon-germanium fins fabricated using germanium condensation on vertical compliant structures", Dec. 2005, Appl. Science Letters 87, 262104-1-262104-3.*

Balakumar et al., "SiGeO layer formation mechanism at the SiGe/oxide interfaces during Ge condensation," Appl. Phys. Lett., 90:032111, 2007.

Souriau et al., "High-Hole-Mobility Silicon Germanium on Insulator Substrates with High Crystalline Quality Obtained by the Germanium Condensation Technique," Journal of the Electrochemical Society, 156:H208-13, 2009.

Sugiyama et al., "Temperature effects on Ge condensation by thermal oxidation of SiGe-on-insulator structures," J Appl. Phys., 95:4007-11, 2004.

Tezuka et al., "Strained SOI/SGOI dual-channel CMOS technology based on the Ge condensation technique," Semicond. Sci. Technol., 22:S93-98, 2007.

Vincent et al., "Stacking fault generation during relaxation of silicon germanium on insulator layers obtaied by the Ge condensation technique," Appl. Phys. Lett., 90:074101, 2007.

Vincent, "Ge-GeSn EPI Updated Ge Fin Condensation," IMEC Presentation, 2011.

* cited by examiner

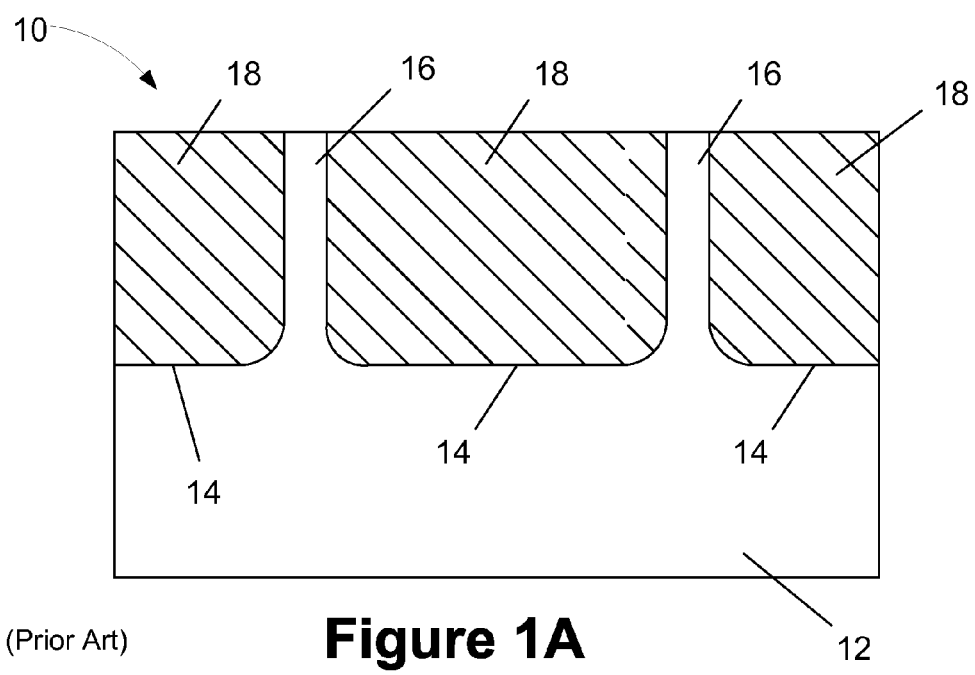
(Prior Art) Figure 1A

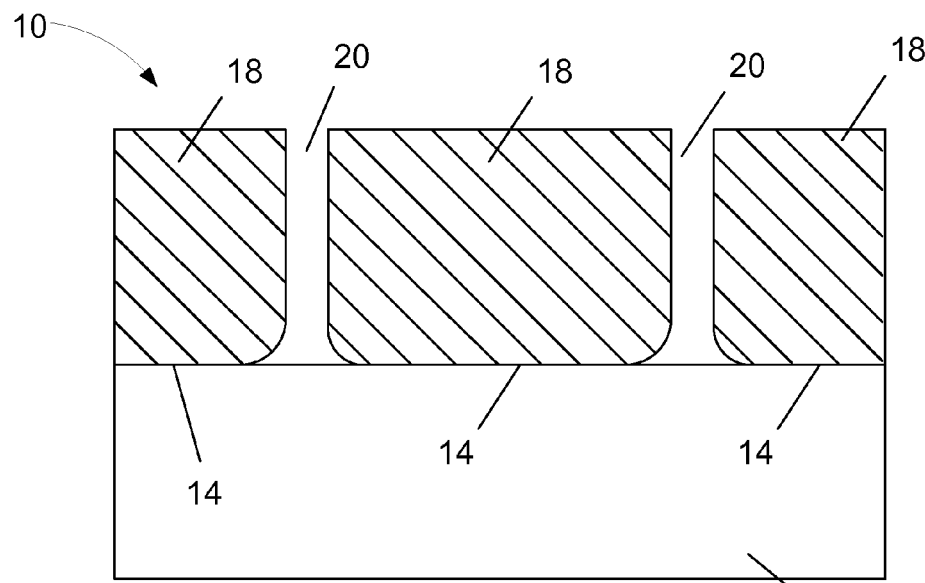
(Prior Art) Figure 1B
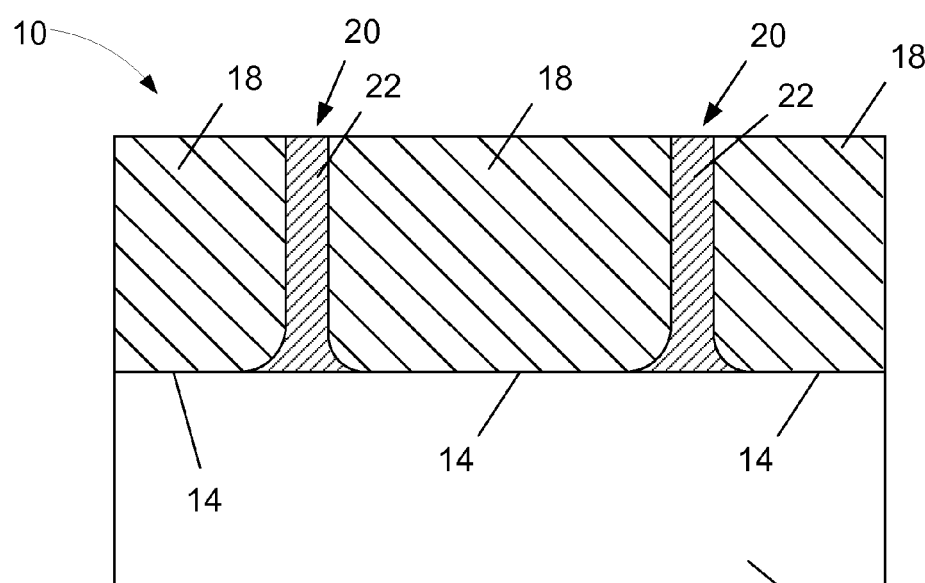
(Prior Art) Figure 1C

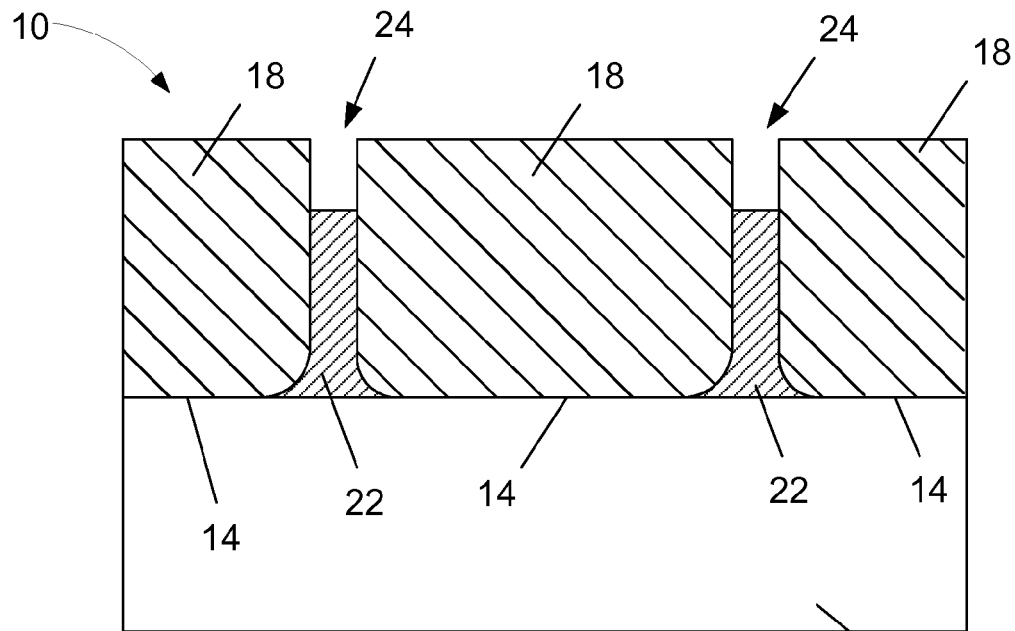
(Prior Art) Figure 1D
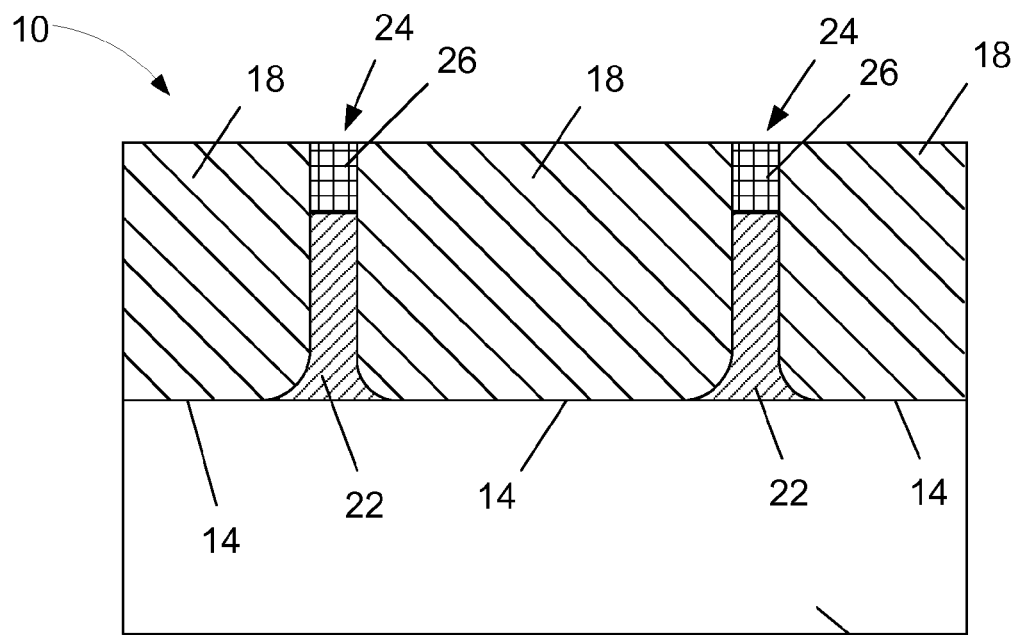
(Prior Art) Figure 1E

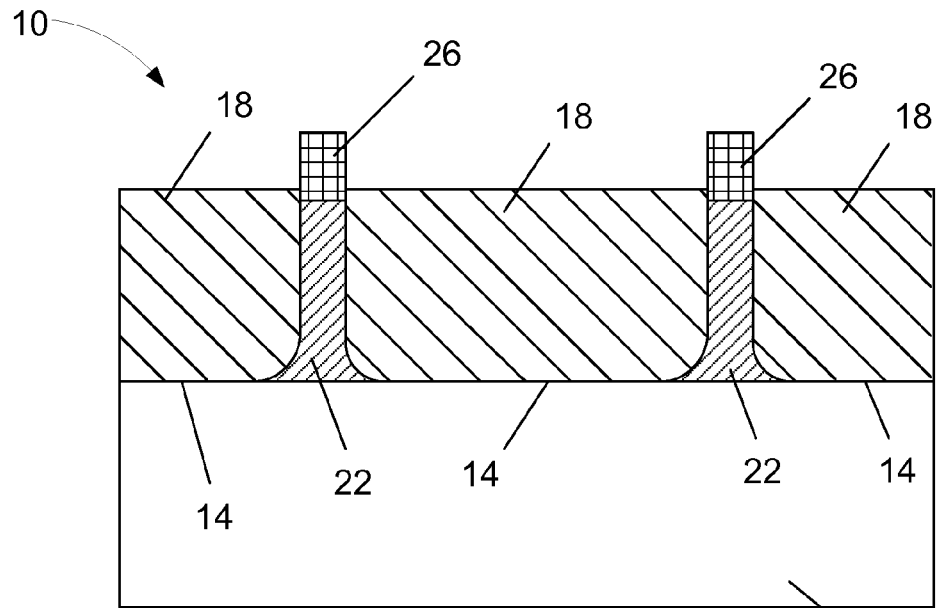
(Prior Art) Figure 1F
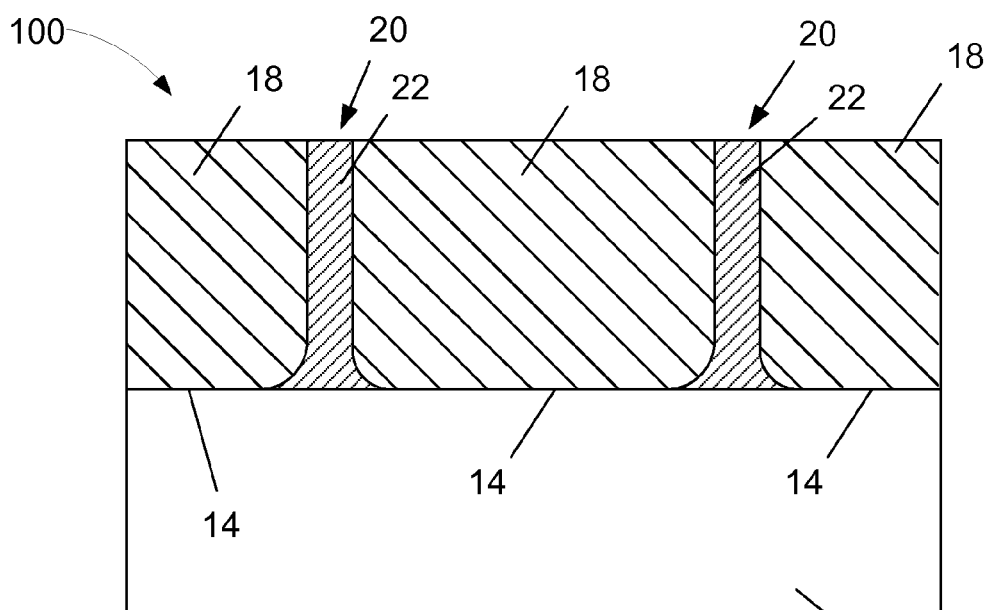
Figure 2A

METHODS OF FORMING FINS FOR A FINFET DEVICE WHEREIN THE FINS HAVE A HIGH GERMANIUM CONTENT

BACKGROUND OF THE INVENTION

1. Field of the Invention

Generally, the present disclosure relates to the manufacture of sophisticated semiconductor devices, and, more specifically, to various methods of forming fins for a FinFET device wherein the fins have a high germanium content.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive and electrical current is permitted to flow between the source region and the drain region through the conductive channel region. The above description is applicable for both the N-type FET as well as the P-type FET, except that the polarity of voltage in operation and the doping type of the source, the channel and the drain regions are correspondingly reversed. In so-called CMOS (Complementary Metal Oxide Semiconductor) technology, both N-type and P-type MOSFETs (which are referred to as being "complementary" to each other) are used in integrated circuit products. CMOS technology is the dominant technology as it relates to the manufacture of almost all current-day large scale logic and memory circuits.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain, which is commonly referred to as a "punch-through" of the electrical potential from the drain to the source and leads to larger leakage currents. This is sometimes referred to as a so-called short channel effect, wherein the characteristic of the FET as an active switch is degraded.

In contrast to a planar FET, which has a planar structure, there are so-called three-dimensional (3D) devices, such as an illustrative FinFET device, which is a three-dimensional structure. More specifically, in a FinFET, a generally vertically positioned, fin-shaped active area is formed and a gate electrode encloses both of the sides and the upper surface of the fin-shaped active area to form a "tri-gate" structure so as to use a channel having a 3D "fin" structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the depletion width in the "fin" channel (as a result of the better electrostatic characteristics of the tri-gate or dual-gate structure around the fin channel) and thereby reduce so-called short channel effects. Also, in a FinFET, the junction capacitance at the drain region of the device is greatly reduced, which tends to reduce at least some short channel effects.

When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the channel width is approximately two times (2×) the vertical fin height plus the width of the top surface of the fin, i.e., the fin width. Multiple fins can be formed in the same footprint as that of a planar transistor device. Accordingly, for a given plot space (or footprint), FinFETs tend to be able to generate significantly stronger drive current than planar transistor devices. Additionally, the leakage current of FinFET devices after the device is turned "OFF" is significantly reduced as compared to the leakage current of planar transistor devices due to the superior gate electrostatic control of the "fin" channel on FinFET devices. In short, the 3D structure of a FinFET device is a superior MOSFET structure as compared to that of a planar transistor, especially in the 20 nm CMOS technology node and beyond. FinFETs have been demonstrated on both standard silicon substrates (bulk FinFETs) and on silicon-on-insulator (SOI) substrates.

The drive current capability of an N-type transistor device is determined based upon the mobility of electrons in the semiconducting substrate. Conversely, for a P-type transistor device, the drive current capability of the device depends upon the mobility of holes in the semiconducting substrate. Historically, both N-type devices and P-type devices were formed in a substrate comprised of silicon.

FIGS. 1A-1F depict one illustrative prior art technique for forming silicon/germanium fins for a FinFET device 10. FIG. 1A depicts the device 10 after several process operations have been performed. Initially, a plurality of trenches 14 were etched into a silicon substrate 12 using known masking and etching processes and the trenches 14 were overfilled with a layer of insulating material 18, such as silicon dioxide. Thereafter, a chemical mechanical polishing (CMP) process was performed to planarize the upper surface of the insulating material 18 with the top of the fins 16 (or the top of a patterned hard mask (not shown)). Next, as shown in FIG. 1B, an etching process was performed to remove the silicon fins 16 and thereby define a plurality of cavities 20 in the layer of insulating material 18. FIG. 1C depicts the device 10 after an epitaxial deposition process was performed to form silicon/germanium fins 22 and after an optional CMP process was performed to planarize the upper surface of the silicon/germanium fins 22 with the upper surface of the layer of insulating material 18. The silicon/germanium fins 22 were typically formed so as to have a germanium concentration that fell within the range of about 20-80%. Next, as shown in FIG. 1D, a timed etching process was performed to remove portions of the exposed silicon/germanium fins 22 which resulted in the formation of the depicted cavities 24. FIG. 1E depicts the device 10 after another epitaxial deposition process was performed to form germanium-rich silicon/germanium material 26 in the cavities 24 and an optional CMP process was performed to planarize the upper surface of the germanium-rich silicon/germanium material 26 with the upper surface of the layer of insulating material 18. The germanium concentration of the germanium-rich silicon/germanium material 26 was typically greater than the germanium concentration of the silicon/germanium fins 22. In one example, the germanium concentration of the germanium-rich silicon/germanium material 26 was typically about 40-100%. FIG. 1F depicts the device 10 after an etching process was performed to recess the layer of insulating material 18 between the fins and thereby expose the upper portions of the fins, which corresponds to the final fin height of the fins. At the point of fabrication depicted in FIG. 1F, traditional manufacturing operations would then be performed to complete the fabrication of the device 10, e.g., formation of a gate structure, formation of doped regions, etc. While the prior art process described above is known to those skilled in the art, the industry needs a new and novel method of forming silicon/germanium fins on FinFET devices.

The present disclosure is directed to various methods of forming fins for a FinFET device, wherein the fins have a high germanium content, that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming fins for a FinFET device wherein the fins have a high germanium content. One illustrative method disclosed herein includes forming a silicon/germanium fin in a layer of insulating material, wherein the fin has a first germanium concentration, recessing an upper surface of the layer of insulating material so as to expose a portion of the fin, performing an oxidation process so as to oxidize at least a portion of the fin and form a region in the exposed portion of the fin that has a second germanium concentration that is greater than the first germanium concentration, removing oxide materials formed on the fin during the oxidation process so as to expose the portion of the fin having the second germanium concentration and forming a gate structure that is positioned around at least the region having the second germanium concentration.

Another illustrative method disclosed herein includes forming a silicon/germanium fin in a layer of insulating material, wherein the fin has a first germanium concentration, recessing an upper surface of the layer of insulating material so as to expose a portion of the fin, performing an oxidation process so as to oxidize at least a portion of the fin and form a region in the exposed portion of the fin that has a second germanium concentration that is greater than the first germanium concentration, wherein the oxidation process is performed at a temperature that falls within the range of about 850-1200° C. for a duration of about 0.1-720 minutes and wherein the region extends throughout an entire width of the fin positioned above the recessed surface of the layer of insulating material, performing an etching process to remove oxide materials formed on the fin during the oxidation process so as to expose the portion of the fin having the second germanium concentration and forming a gate structure that is positioned around at least the region having the second germanium concentration.

Yet another illustrative method disclosed herein includes forming a silicon/germanium fin in a layer of insulating material, wherein the fin has a first germanium concentration, recessing an upper surface of the layer of insulating material so as to expose a portion of the fin, performing an oxidation process so as to oxidize at least a portion of the fin and form a region in the exposed portion of the fin that has a second germanium concentration that is greater than the first germanium concentration, wherein the oxidation process is performed at a temperature that falls within the range of about 800-1150° C. for a duration of about 0.1-600 minutes and wherein the region in the exposed portion of the fin having the second germanium concentration has a thickness that is less than an entire width of the fin, performing an etching process to remove oxide materials formed on the fin during the oxidation process so as to expose the portion of the fin having the second germanium concentration and forming a gate structure that is positioned around at least the region having the second germanium concentration.

BRIEF DESCRIPTION OF THE DRAWINGS

The disclosure may be understood by reference to the following description taken in conjunction with the accompanying drawings, in which like reference numerals identify like elements, and in which:

FIGS. 1A-1F depict one illustrative prior art method of forming silicon/germanium fins for a FinFET device;

FIGS. 2A-2E depict various illustrative methods disclosed herein for forming fins for a FinFET device wherein the fins have a high germanium content;

Figure 2B:
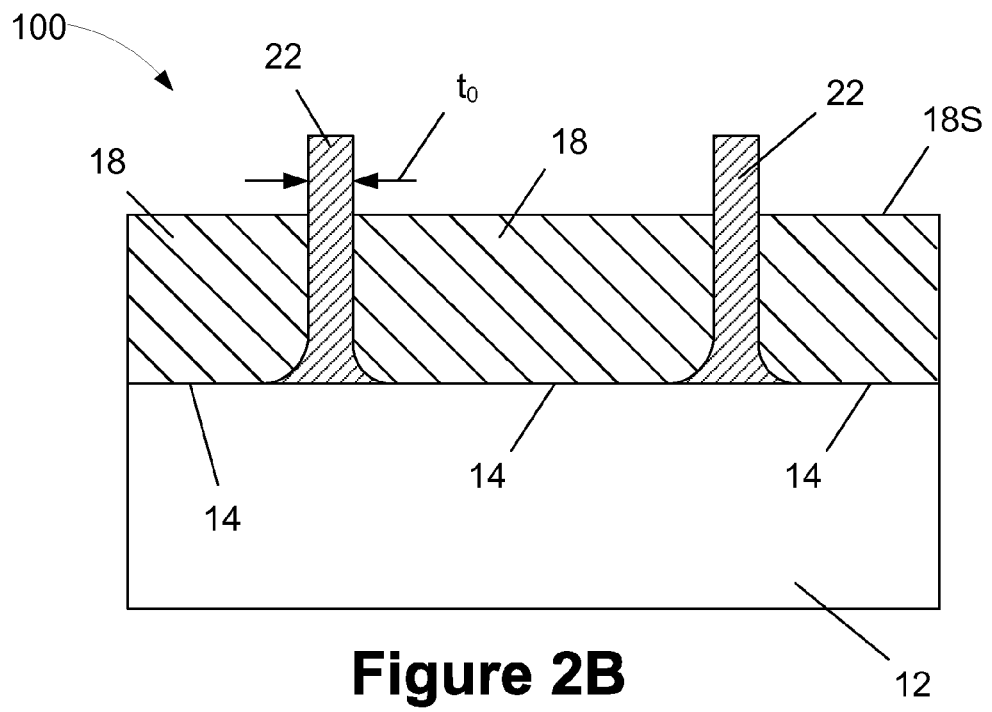

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming fins for a FinFET device wherein the fins have a high germanium content. As will be readily apparent to those skilled in the art upon a complete reading of the present application, the methods disclosed herein may be employed in manufacturing a variety of different devices, including, but not limited to, logic devices, memory devices, etc., and they may be employed with respect to a variety of different technologies, e.g., P-type devices, CMOS applications, etc. With reference to the attached figures, various illustrative embodiments of the methods and devices disclosed herein will now be described in more detail.

FIGS. 2A-2E depict various views of an illustrative Fin-FET device 100 wherein the fins are formed so as to have a high germanium content. The point of fabrication depicted in FIG. 2A corresponds approximately to the point of fabrication of the device 10 depicted in FIG. 1C above, i.e., after the silicon/germanium fins 22 have been formed in the cavities 20 in the layer of insulating material 18. The width of the fins 22 may vary depending upon the particular application, e.g., 4-50 nm. The illustrative substrate 12 may be a bulk semiconducting substrate, or it may be the silicon active layer of a so-called silicon-on-insulator (SOI) substrate, or it may be the active layer of a so-called silicon-germanium-on-insulator (SGOI) substrate. Thus, the terms "substrate" or "semiconducting substrate" should be understood to cover all semiconducting materials and all forms of such material. The layer of insulating material 18 may be comprised of a variety of different insulating materials, e.g., silicon dioxide, etc., and it may be initially deposited using a variety of known techniques, e.g., chemical vapor deposition (CVD), atomic layer deposition (ALD), etc.

FIG. 2B depicts the device 100 after an etching process has been performed to recess the layer of insulating material 18 such that portions of the silicon/germanium fins 22 extend above a recessed surface 18S of the layer of insulating material 18. The amount or length of the fins 22 extending above the recessed surface 18S may vary depending upon the particular application, e.g., 5-50 nm.

Figure 2C:
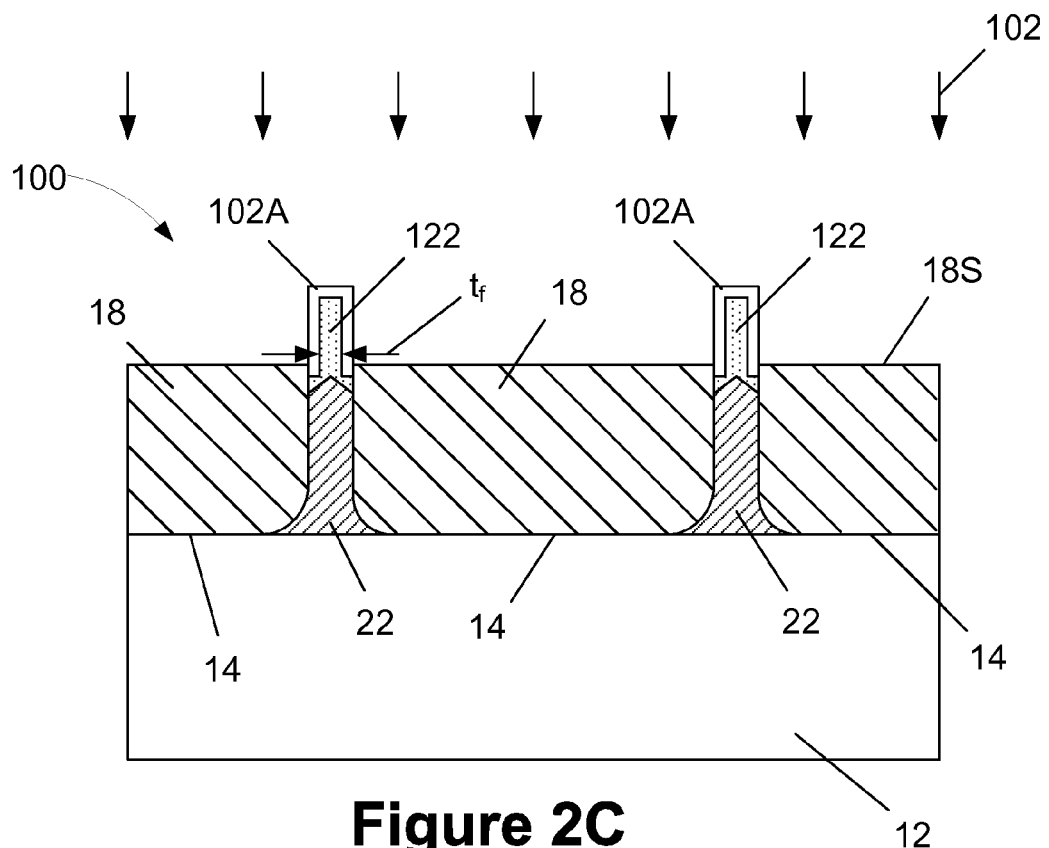

Next, as shown in FIG. 2C, in one illustrative embodiment, an oxidation process 102 is performed so as to form a layer of silicon dioxide 102A on the exposed portions of the silicon/germanium fins 22. The oxidation process 102 results in the formation of a region 122 of the silicon/germanium fins 22 that has an increased or higher concentration of germanium relative to the concentration of germanium in the other portions of the silicon/germanium fins 22. In some cases, the region 122 may extend throughout substantially the entire width or thickness of the exposed fin as depicted in FIG. 2C. In one illustrative embodiment, the concentration of germanium in the region 122 may be equal to or greater than about 50%, and in even more specific embodiments, the germanium concentration may be within the range of about 60-75%, and in even more specific embodiments, the germanium concentration may be within the range of about 75-90%, and in even more specific embodiments, the germanium concentration in the region 122 may be equal to or greater than about 90%. In some applications, the concentration of germanium in the region 122 may be about 1.1-4 times the concentration of germanium in the original silicon/germanium fins 22. In one illustrative example, the oxidation process 102 is designed to be a relatively slow oxidation process with a relatively low rate of oxidation. Using such a slow process allows the formation of a substantially pure layer of silicon dioxide 102A and it allows sufficient time for the germanium in the original silicon/germanium material of the fins 22 to be effectively consolidated in the remaining portion of the exposed portions of the fins 22.

The actual oxidation conditions will depend upon the initial germanium (Ge) concentration in the silicon/germanium film, i.e., the fins 22, the final desired germanium concentration after the oxidation process is performed, the thermal budget permissible in manufacturing other structures on the device, etc. This will be will be an issue of optimization using principles and methods well known in the art. For example, the liquidus temperature for $Si_{1-x}Ge_x$ alloys decreases monotonically from the melting point of pure Si (1414° C.) for x=0 to that of pure Ge (938° C.) for x=1 such that a multistage (or ramped) anneal may be needed with an initially high temperature that is reduced in subsequent stage(s) as the higher germanium concentration in the alloy results in a reduction in the liquidus temperature. Information on optimization of oxidation conditions to increase the germanium concentration of a SiGe alloy can be found in many papers in the literature, including S. Balakumar et al, *Applied Physics Letters,* 90:03211 (2007), N. Sugiyama et al, *Journal of Applied Physics,* 95:4007 (2004), T. Tezuka et al, *Semiconductor Science and Technology,* 22:S93 (2007), B. Vincent et al, *Applied Physics Letters,* 90:074101 (2007), and L. Souriau et al, *Journal of the Electrochemical Society,* 156:H208 (2009). Each of the forgoing references are hereby incorporated by reference in their entirety.

In one illustrative embodiment, the oxidation process 102 may be performed in a temperature that falls within the range of about 850-1200° C. for a duration of about 0.1-720 minutes. In another illustrative embodiment, the oxidation process 102 may be performed in a standard furnace at a temperature that falls within the range of about 900-1100° C. for a duration of about 1-600 minutes. In yet another illustrative embodiment, the oxidation process 102 may be performed in a multistage process where a first oxidation temperature falls between about 1000° C. and about 1150° C. and the final oxidation temperature falls between about 850° C. and 950° C., where the duration of each oxidation temperature is about 0.1-300 minutes. In still another illustrative embodiment, the oxidation process 102 may be performed where the temperature is ramped from a first oxidation temperature between about 1000° C. and about 1150° C. to a final oxidation temperature between about 850° C. and 950° C., where the temperature ramp rate is in the range of 0.1 to 600° C./min.

During the oxidation process 102, some of the exposed portions of the silicon/germanium fins 22 are consumed. The amount consumed depends upon the initial and final thicknesses of the fins 22 and the region 122 and the initial and final concentration of germanium in the fins 22 and in the region 122 after the oxidation process 102 is performed, as set forth in the following formula:

$$t_f = t_0(C_0/C_f) \text{ where}$$

$t_f$=final thickness of region 122 post-oxidation (see FIG. 2C);

$t_0$=initial thickness of exposed portions of fin 22 pre-oxidation (see FIG. 2B);

$C_0$=initial germanium concentration in fin 22 pre-oxidation; and $C_f$=germanium concentration in region 122 of post-oxidation.

Thus, in one example where the final germanium concentration ($C_f$) is twice that of the initial germanium concentration ($C_0$), the final thickness ($t_f$) will be about one-half that of the initial thickness ($t_0$) of the fins 22.

Figure 2D:
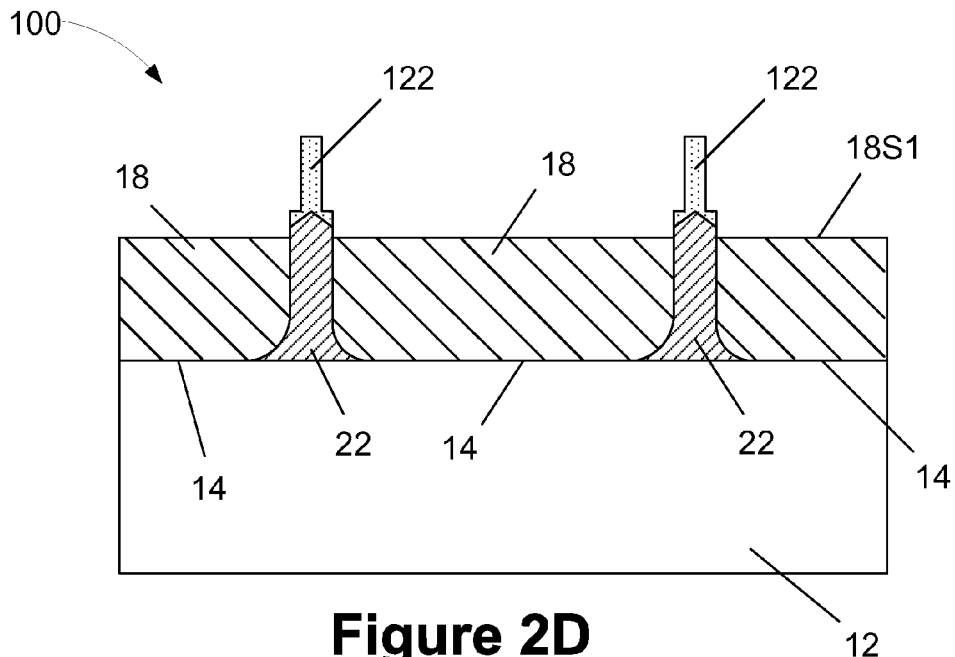

FIG. 2D depicts the device 100 after another etching process is performed to strip the layer of silicon dioxide 102A that was formed during the oxidation process 102. This etching process will also recess the layer of insulating material 18 to a lower level surface 18S1. This etching process effectively defines the approximate final height of the fins for the device 100.

Figure 2E:
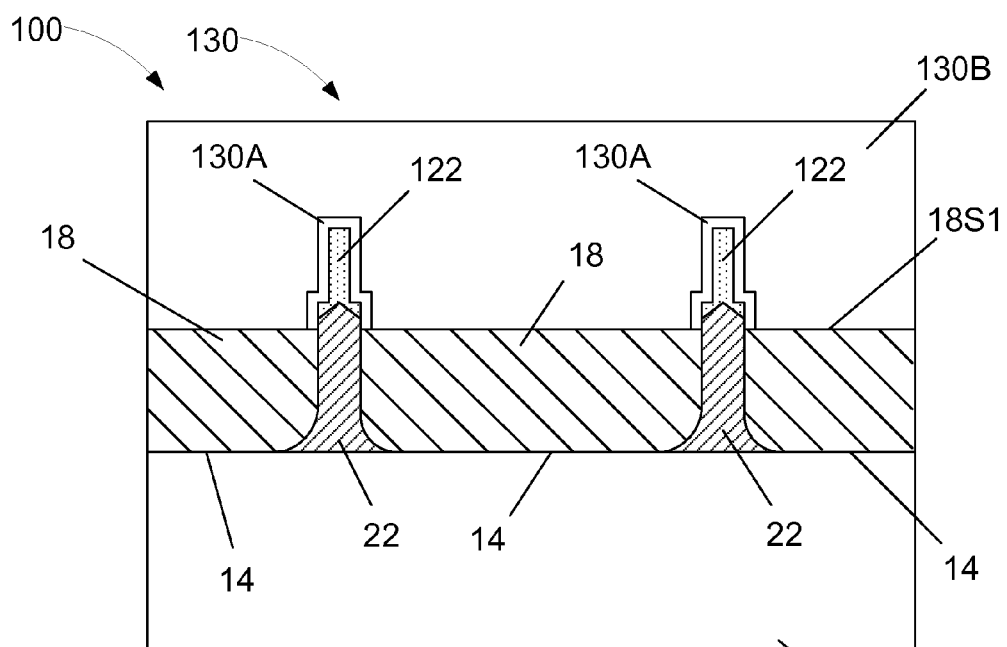

FIG. 2E depicts the device 100 after an illustrative gate structure 130 comprised of an illustrative gate insulation layer 130A and an illustrative gate electrode 130B has been formed on the device 100. An illustrative gate cap layer (not shown) may also be present at this time above the illustrative gate electrode 130B. As will be recognized by those skilled in the art after a complete reading of the present application, the gate structure 130 of the device 100 depicted in the drawings, i.e., the gate insulation layer 130A and the gate electrode 130B, is intended to be representative in nature. For example, the gate insulation layer 130A may be comprised of a variety of different materials, such as, for example, silicon dioxide, a high-k (k greater than 8) dielectric material (where k is the relative dielectric constant), etc. The gate electrode 130B may be comprised or one or more layers of conductive material, e.g., doped polysilicon, one or more layers of metal, a metal nitride, etc. The gate structure 130 may be formed using either "gate-first" or "replacement gate" (also known as "gatelast") techniques. The gate insulation layer 130A could be a conformal layer of material, e.g., a conformal layer of high-k insulating material comprising $HfO_2$, $ZrO_2$, $Al_2O_3$, $TiO_2$, $Gd_2O_3$, and/or mixtures thereof deposited by, for example, atomic layer deposition (ALD). The gate insulation layer 130A may additionally contain a passivation layer under the high-k layer comprising Si, $SiO_2$ and/or $GeO_2$. At the point of fabrication depicted in FIG. 2E, traditional processing operations may be performed to complete the fabrication of the device 100, e.g., the formation of various doped regions, metal silicide regions, conductive contacts metallization layers, etc. For a replacement gate flow, a dummy gate structure may be used temporarily in the process flow before the final gate structure 130 is fabricated.

Figure 3A:
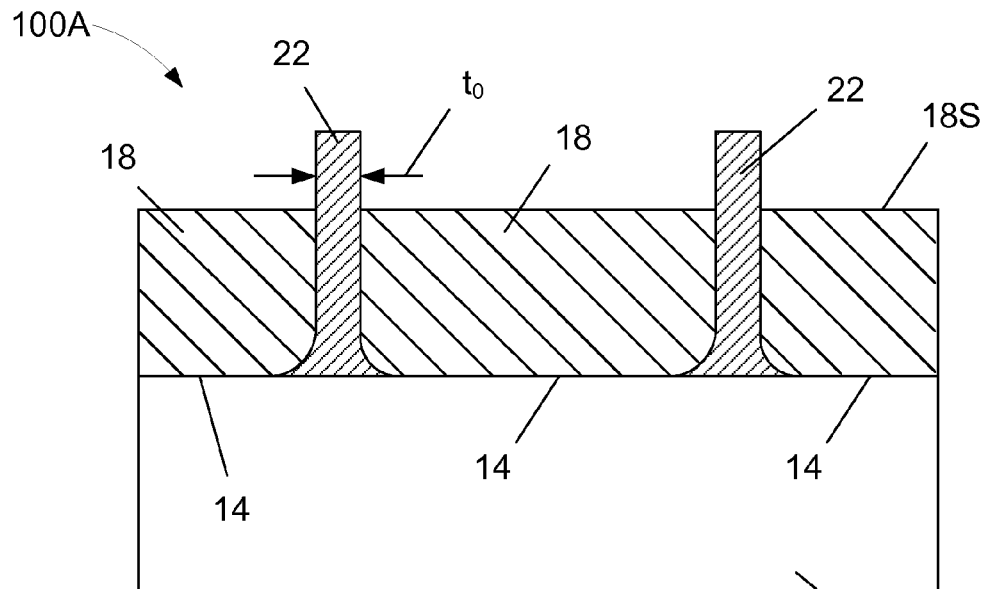
FIGS. 3A-3C depict other illustrative methods disclosed herein for forming fins for a FinFET device wherein the fins have a high germanium content.
Figure 3B:
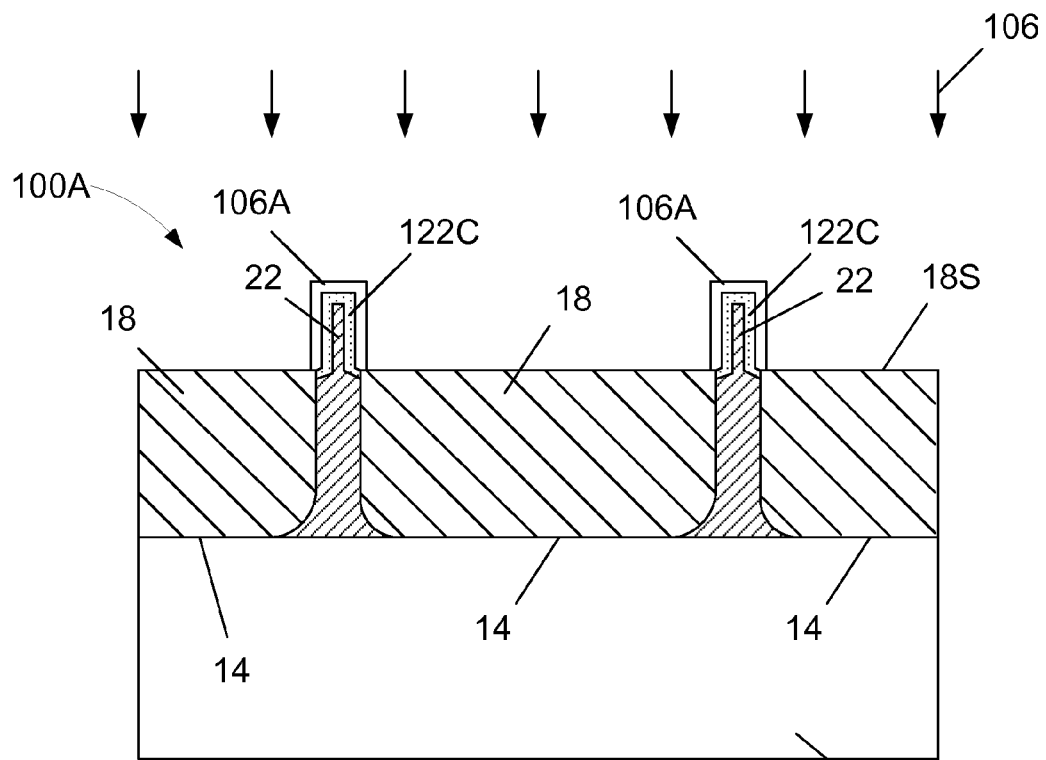
Figure 3C:
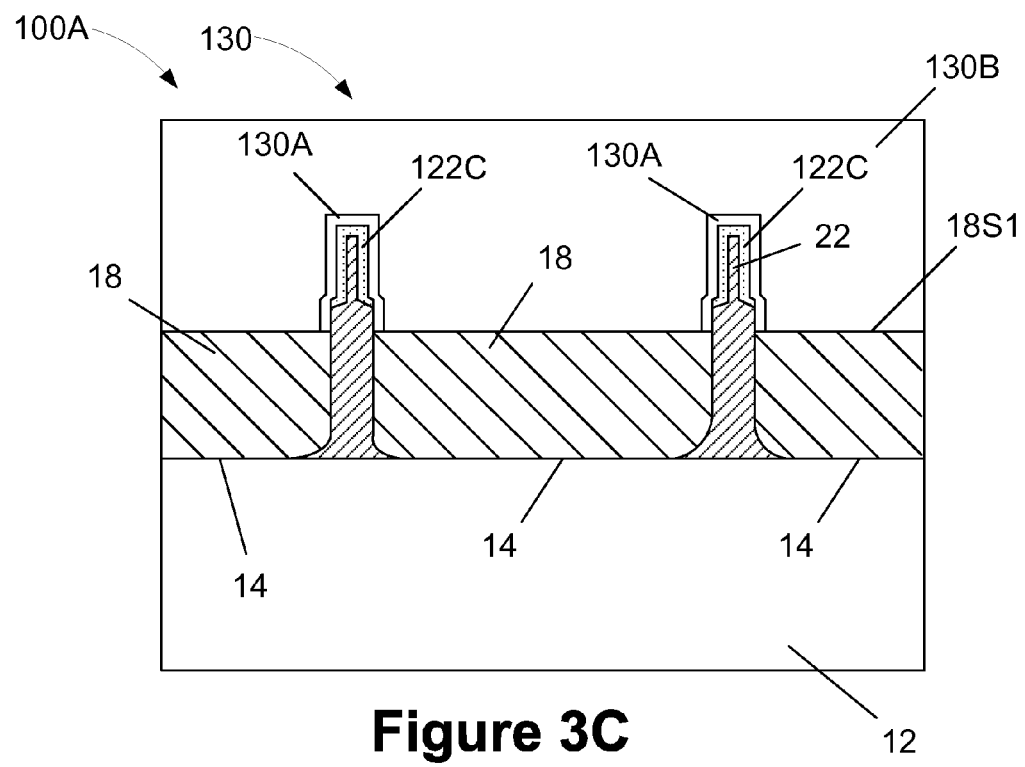

FIGS. 3A-3C depict another illustrative embodiment of a method that may be employed to form an illustrative FinFET device 100A wherein the fins are formed so as to have a high germanium content. The point of fabrication depicted in FIG. 3A corresponds approximately to the point of fabrication of the device 100 depicted in FIG. 2B above, i.e., after the layer of insulating material 18 has been initially recessed so as to expose portions of the silicon/germanium fins 22.

Next, as shown in FIG. 3B, in one illustrative embodiment, an oxidation process 106 is performed so as to form a layer of silicon dioxide 106A on the exposed portions of the silicon/germanium fins 22. The oxidation process 106 results in the formation of a thin region 122C of the silicon-germanium fins 22 that has an increased or higher concentration of germanium relative to the concentration of germanium in the other portions of the silicon/germanium fins 22. In the depicted example, the region 122C does not extend throughout the entire width or thickness of the fin as depicted in FIG. 3B, i.e., the region 122C has a thickness that is less than the initial width ($t_0$) of the fins 22. Rather, in this embodiment, the region 122C is more like a "cladding" around the exterior of the exposed portions of the fin 22. In some embodiments, the region 122C may be only about 2-5 nm in thickness. This cladding or region 122C then contains a higher percentage of germanium than the core of the fin, which allows for a higher carrier mobility and improved device performance. As with the previous oxidation process 102, in one illustrative embodiment, the concentration of germanium in the region 122C may be equal to or greater than about 50%, and in even more specific embodiments, the germanium concentration may be within the range of about 60-75%, and in even more specific embodiments, the germanium concentration may be within the range of about 75-90%, and in even more specific embodiments, the germanium concentration in the region 122C may be equal to or greater than about 90%. In this example, the oxidation process 106 is designed to allow the formation of a substantially pure layer of silicon dioxide 106A and allow sufficient time for the germanium in the original silicon/germanium material of the fins 22 to be effectively consolidated in region 122C of the exposed portions of the fins 22, but not the whole width of fin. In practice, this method would not form abrupt layers as indicated schematically in FIG. 3B, but rather a graded germanium concentration in which the outer portion of the fin has the highest percentage of germanium, the center of the fin has a lower germanium concentration, but still higher than that of the original composition in the silicon/germanium layer formed to make the fins 22. In one illustrative embodiment, the overall temperature ranges and times for the oxidation process 106 may be about the same as those described above for the oxidation process 102, but, relative to the oxidation process 102, the oxidation process 106 would likely be performed at a reduced temperature and/or for a shorter duration. For example, in one illustrative embodiment, the oxidation process 106 may be performed at about 800-1150° C. for a duration of about 0.1-600 minutes.

FIG. 3C depicts the device 100A after several process operations were performed on the device. Initially, an etching process was performed to strip the layer of silicon dioxide 106A that was formed during the oxidation process 106. This etching process will also recess the layer of insulating material 18 to a lower level surface 18S1. This etching process effectively defines the approximate final height of the fins for the device 100A. Thereafter, the previously described illustrative gate structure 130 was formed on the device 100A.

FIGS. 4A-4D depict yet another illustrative embodiment of a method that may be employed to form an illustrative FinFET device 100B wherein the fins are formed so as to have a high germanium content. The point of fabrication depicted in FIG. 4A corresponds approximately to the point of fabrication of the device 100 depicted in FIG. 2B above, i.e., after the layer of insulating material 18 has been initially recessed so as to expose portions of the silicon/germanium fins 22.

Figure 4A:
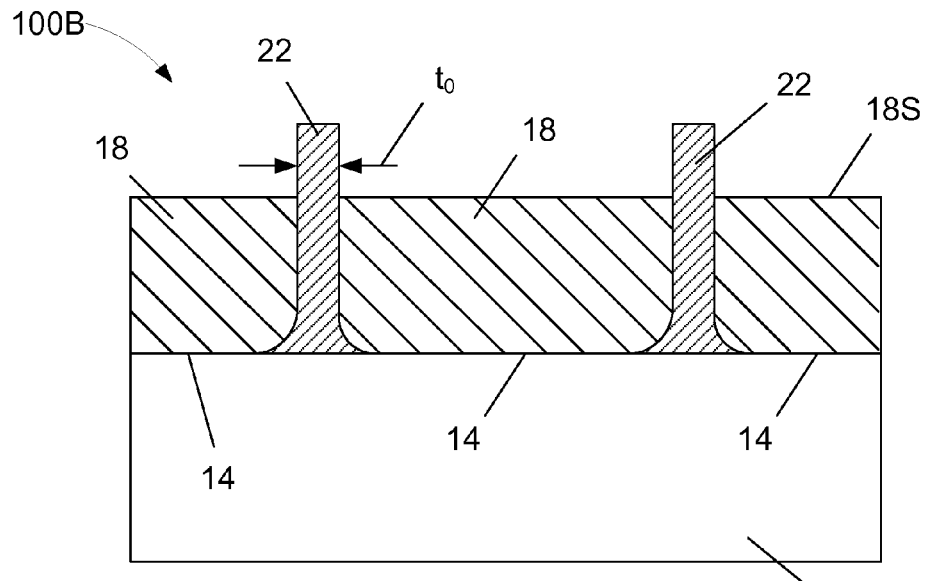
FIGS. 4A-4D depict yet other illustrative methods disclosed herein for forming fins for a FinFET device wherein the fins have a high germanium content.
Figure 4B:
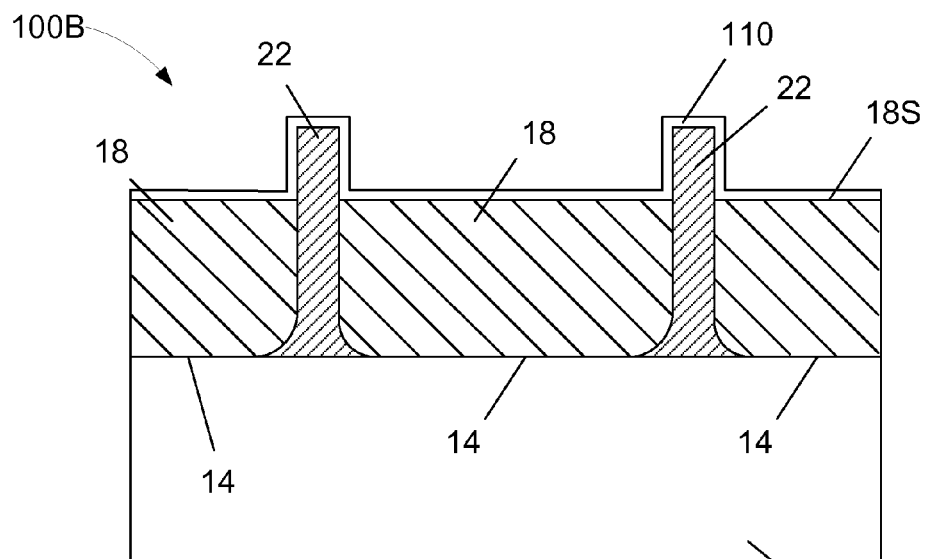
Figure 4C:
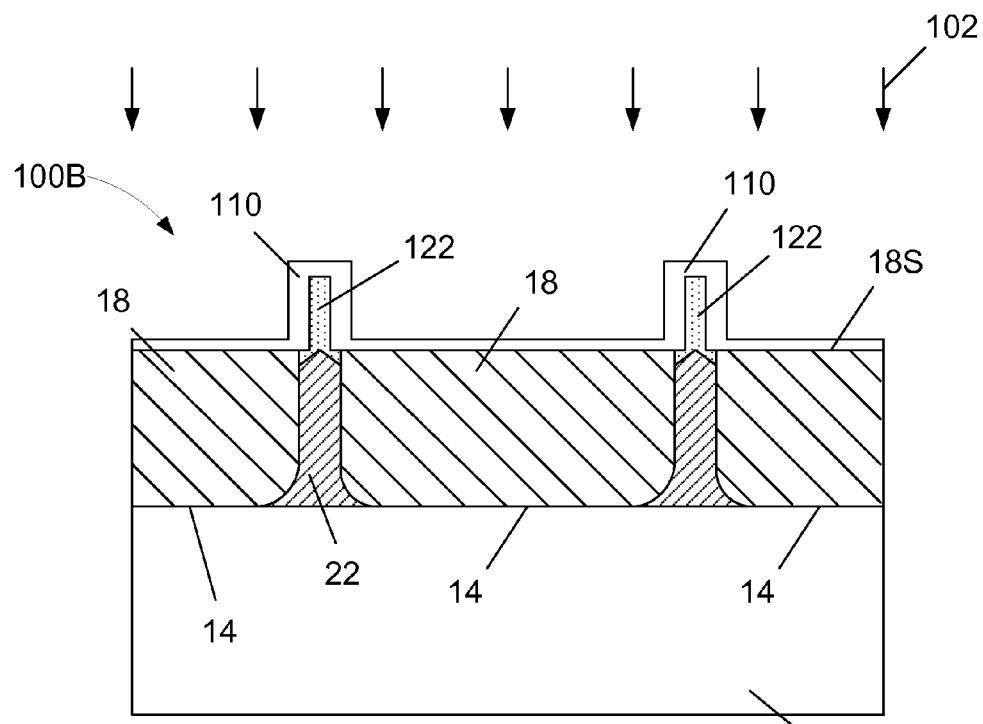
Figure 4D:
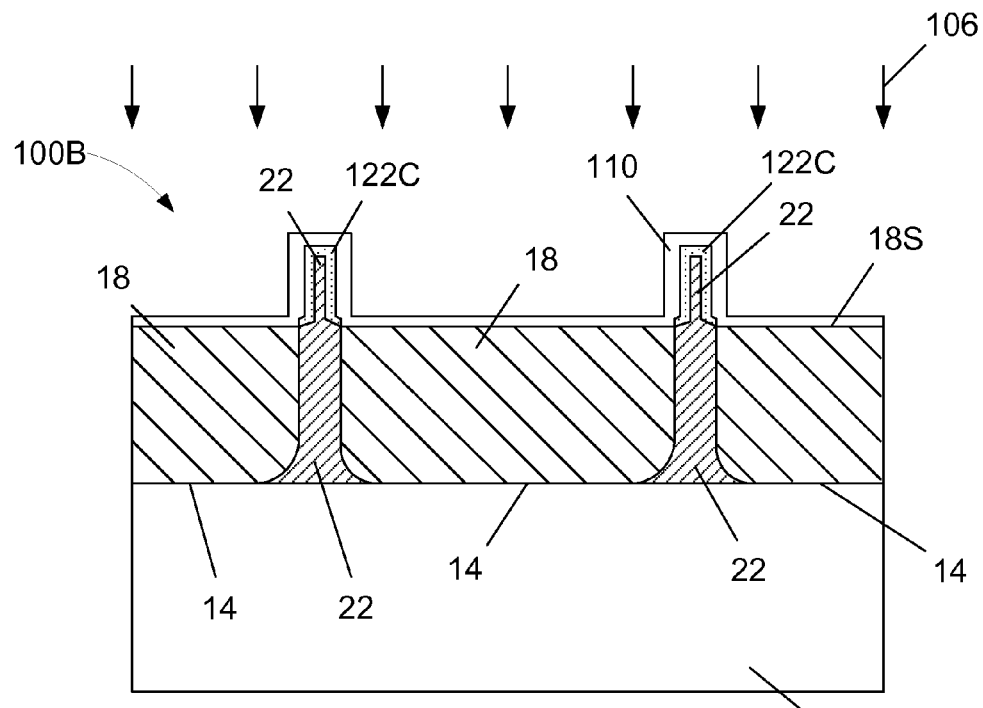

Next, as shown in FIG. 4B, prior to performing an oxidation process, a conformal liner layer of insulating material 110 is deposited on the device 100B. In one illustrative embodiment, the conformal liner layer 110 may be a layer of silicon dioxide, a high-density plasma (HDP) oxide, etc., and it may have a thickness of about 1-5 nm. The conformal liner layer 110 may be formed by performing a variety of known processes, e.g., CVD, ALD, etc. The purpose of the conformal liner layer 110 is to improve the quality of the condensation reaction by slowing the oxidation rate and giving more time for the germanium to diffuse away from the oxidizing interface when portions of the fins 22 are oxidized so as to form the regions 122, 122C as described below. With the conformal liner layer 110 in position, either the oxidation process 102 or the oxidation process 106 may be performed so as to form the regions 122, 122C in/on the fins 22, as depicted in FIGS. 4C and 4D, respectively. After the regions 122, 122C are formed, one or more process operations are performed to further recess the layer of insulating material 18 (similar to the situation shown in FIG. 2D) during which the conformal liner layer 110 and any other oxide materials are removed from the exposed portions of the fins. Thereafter, the previously described illustrative gate structure 130 may be formed on the device 100B.

Figure 5A:
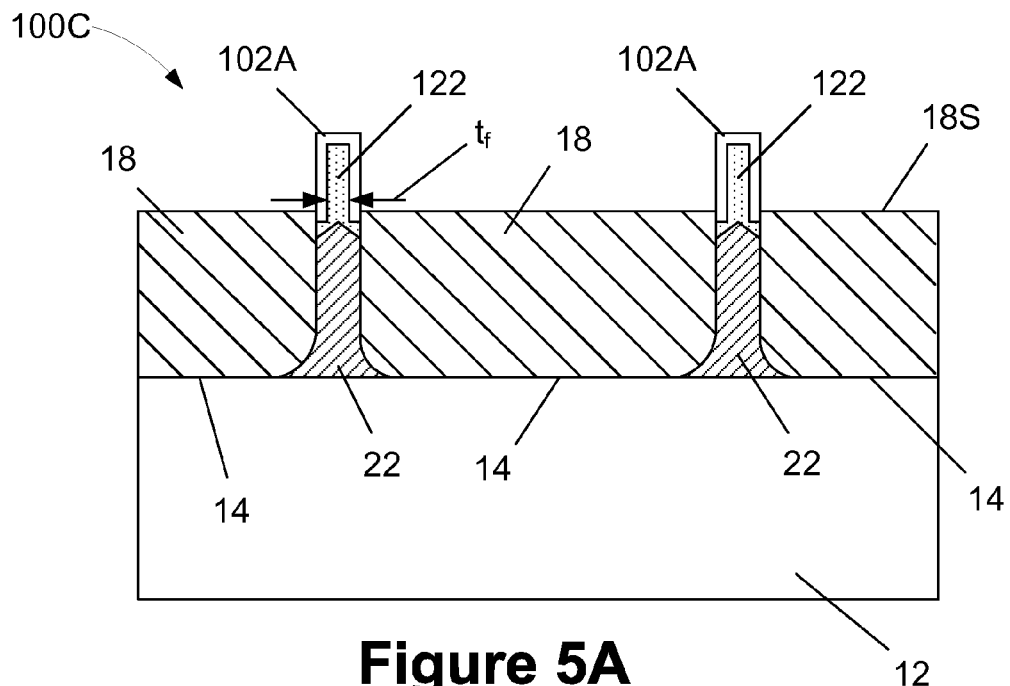
FIGS. 5A-5C depict yet other illustrative methods disclosed herein for forming fins for a FinFET device wherein the fins have a high germanium content.
Figure 5B:
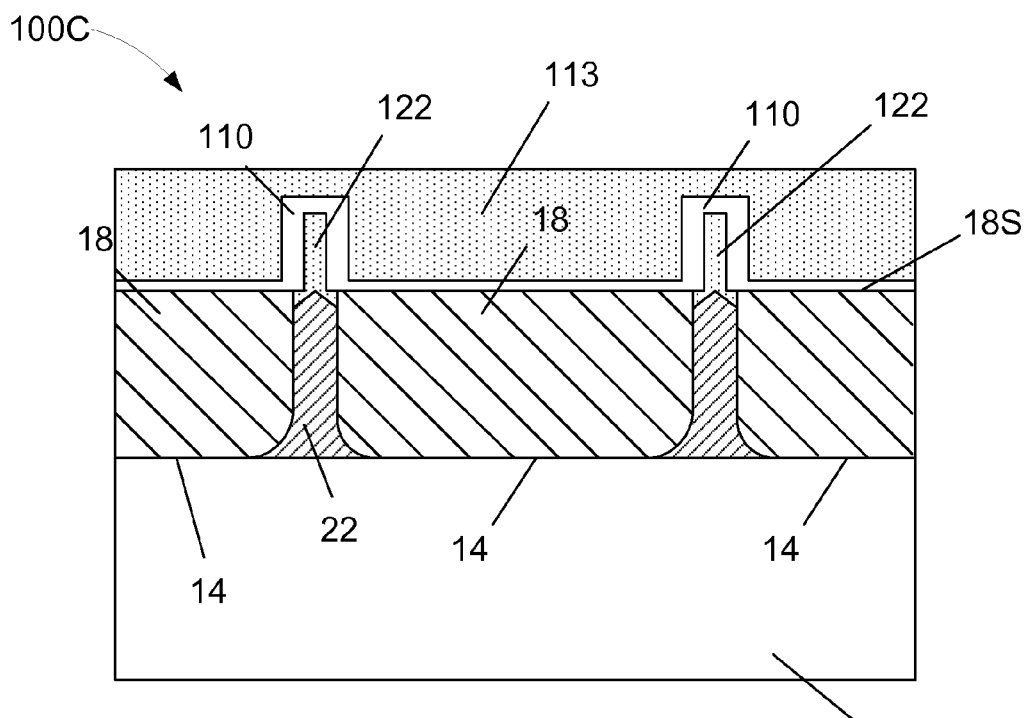
Figure 5C:
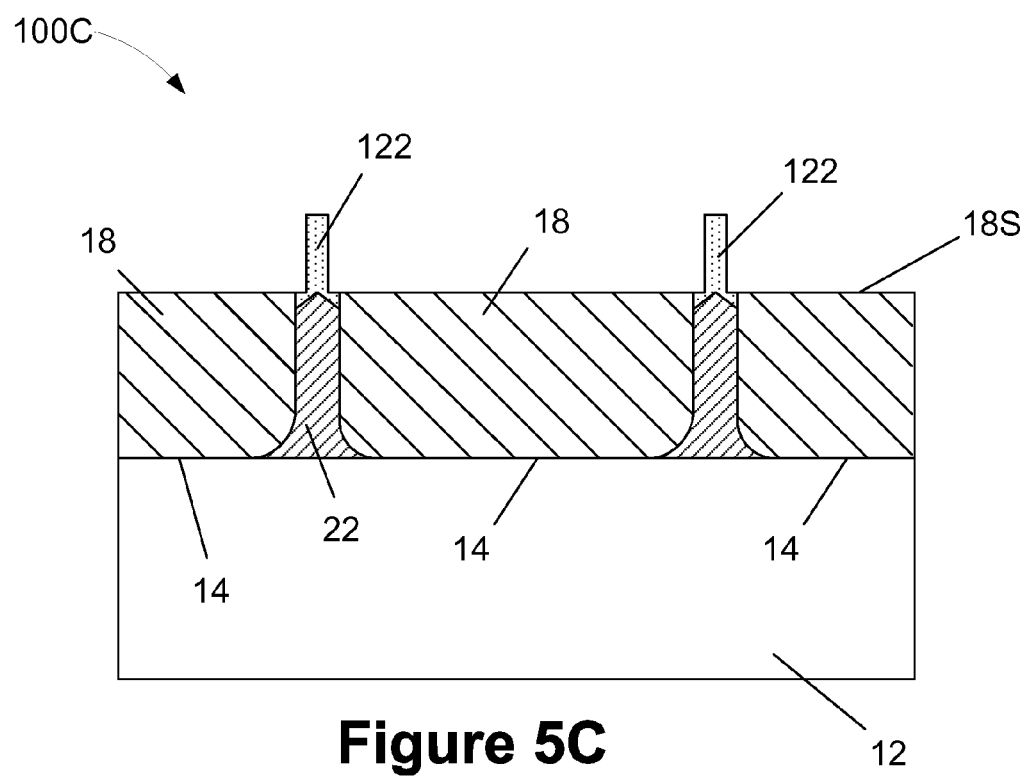

FIGS. 5A-5C depict yet another illustrative embodiment of a method that may be employed to form an illustrative FinFET device 100C wherein the fins are formed so as to have a high germanium content. The point of fabrication depicted in FIG. 5A corresponds approximately to the point of fabrication of the device 100 depicted in FIG. 2C above, i.e., after the oxidation process 102 was performed to form the layer of silicon dioxide 102A on the exposed portions of the silicon/germanium fins 22.

Next, as shown in FIG. 5B, a post-oxidation layer of insulating material 113 is deposited on the device 100C. In one illustrative embodiment, the post-oxidation layer of insulating material 113 may be a layer of silicon dioxide that is formed using a process that effectively fills the trenches 14 from the bottom at a higher rate than at the top using technologies known to those skilled in the art of forming shallow trench isolation structures and/or pre-metal dielectric deposition. The post-oxidation layer of insulating material 113 may have a thickness in the bottom of the trenches of about 5-50 nm. The post-oxidation layer of insulating material 113 may be formed by performing a variety of known processes, e.g., one or more cycles of CVD combined with sputter and/or etch, spin-on glass, or a CVD process combined with a high temperature reflow of the dielectric material. FIG. 5C shows the device 100C after an etch process was performed to remove the oxidized materials around the regions 122 and substantially all of the post-oxidation layer of insulating material 113 without substantially removing any more of the layer of insulating material 18, i.e., without lowering the upper surface 18S of the layer of insulating material 18. In effect, the post-oxidation layer of insulating material 113 acts to protect the layer of insulating material 18 during the etching process that is performed to remove the oxidation materials created during the oxidation process 102 or 106. An optional chemical mechanical polish may be used to remove any substantial insulation material overgrowth on the fins. As will be appreciated by those skilled in the art after a complete reading of the present application, the post-oxidation layer of insulating material 113 may be used with the oxidation process 102, as shown for FIGS. 5A-5C, or with the oxidation process 106 using structures analogous to those in FIGS. 3A-3C, modified to the method of FIGS. 5A-5C. It may also be combined with the pre-oxidation liner layer 110, as shown in FIGS. 4A-4D. Thereafter, the previously described illustrative gate structure 130 may be formed on the device 100C.

In one particular embodiment, the oxidation process 102/106 may be a multistage process where a first oxidation process is performed at a temperature that falls within the range of about 1000° C. and about 1150° C. and a second oxidation process wherein the temperature falls within the range of about 850° C. and 950° C., and wherein the duration of each of the first and second oxidation processes falls within the range of about 0.1-300 minutes. In another embodiment, the oxidation process 102/106 may be a ramped oxidation process where the process temperature is ramped from a first oxidation temperature that falls within the range of about 1000° C. and about 1150° C. to a second oxidation temperature that falls within the range of about 850° C. and 950° C., where the temperature ramp rate is in the range of 0.1 to 600° C./min.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a fin in an insulating material, said fin being comprised of a silicon/germanium material with a first germanium concentration;
   recessing an upper surface of said insulating material so as to expose an upper portion of said silicon/germanium material above said recessed upper surface of said insulating material, said upper portion having an upper surface and side surfaces;
   performing a deposition process to form a conformal liner insulating layer that entirely covers said upper surface and side surfaces of said silicon/germanium material and said upper surface of said insulating material;
   performing an oxidation process in the presence of said conformal liner insulating layer so as to oxidize said upper and side surfaces of said silicon/germanium material and to form a region in said silicon/germanium material having a second germanium concentration that is greater than said first germanium concentration;
   removing oxides formed on said upper and side surfaces during said oxidation process so as to expose said region having said second germanium concentration; and
   forming a gate structure that is positioned around at least said region having said second germanium concentration.

2. The method of claim 1, wherein said performing said oxidation process comprises performing said oxidation process at a temperature that falls within a range of about 850-1200° C. for a duration of about 0.1-720 minutes.

3. The method of claim 1, wherein said performing said oxidation process comprises performing a multistage oxidation process where a first oxidation process is performed at a temperature that falls between about 1000° C. and about 1150° C. and a second oxidation process is performed at a temperature that falls between about 850° C. and 950° C., and wherein a duration of each of said first and second oxidation processes falls within a range of about 0.1-300 minutes.

4. The method of claim 1, wherein said performing said oxidation process comprises performing a ramped oxidation process wherein a temperature of said oxidation process is ramped from a first oxidation temperature between about 1000° C. and about 1150° C. to a final oxidation temperature between about 850° C. and 950° C., wherein a ramp rate of said temperature is in a range of about 0.1 to 600° C./min.

5. The method of claim 1, wherein said region having said second germanium concentration extends throughout an entire width of said silicon/germanium material.

6. The method of claim 1, wherein said region having said second germanium concentration has a thickness that is less than an entire width of said silicon/germanium material.

7. The method of claim 1, wherein said conformal liner insulating layer is comprised primarily of silicon dioxide.

8. The method of claim 1, wherein said second germanium concentration in said region is greater than 50%.

9. The method of claim 1, wherein said second germanium concentration in said region falls within a range of 60-75%.

10. The method of claim 1, wherein said second germanium concentration in said region falls within a range of about 75-90%.

11. The method of claim 1, wherein said second germanium concentration in said region is greater than 90%.

12. The method of claim 1, wherein said second germanium concentration in said region is about 1.1-4 times that of said first germanium concentration.

13. The method of claim 1, wherein, after said performing said oxidation process and prior to said removing said oxides, the method further comprises forming a post-oxidation insulating layer on said oxidized upper and side surfaces and on said insulating material.

14. The method of claim 13, wherein portions of said post-oxidation insulating layer have a thickness of about 5-50 nm.

15. The method of claim 13, wherein a chemical mechanical polishing (CMP) process is performed after said forming of said post-oxidation insulating layer and before said removing said oxides formed on said silicon/germanium material.

16. A method, comprising:
   forming a plurality of trenches in a semiconducting substrate comprised of silicon to thereby define a first fin comprised of said silicon;
   forming an insulating material in said plurality of said trenches;
   performing an etching process to remove at least a portion of said first fin so as to thereby define a cavity in said insulating material;
   performing an epitaxial deposition process to form a second fin comprised of a silicon/germanium material in said cavity in said insulating material, said silicon/germanium material having a first germanium concentration;
   recessing an upper surface of said insulating material so as to expose an upper portion of said silicon/germanium material above said recessed upper surface of said insulating material, said upper portion having an upper surface and side surfaces;
   performing an oxidation process so as to oxidize said upper and side surfaces of said silicon/germanium material and to form a region in said silicon/germanium material having a second germanium concentration that is greater than said first germanium concentration;
   performing at least one etching process to remove oxides formed on said upper and side surfaces during said oxidation process so as to expose said region having said second germanium concentration; and
   forming a gate structure that is positioned around at least said region having said second germanium concentration.

17. The method of claim 16, wherein said performing said oxidation process comprises performing said oxidation process at a temperature that falls within a range of about 850-1200° C. for a duration of about 0.1-720 minutes.

18. The method of claim 16, wherein said performing said oxidation process comprises performing a multistage oxidation process where a first oxidation process is performed at a temperature that falls between about 1000° C. and about 1150° C. and a second oxidation process is performed at a temperature that falls between about 850° C. and 950° C., and wherein a duration of each of said first and second oxidation processes falls within a range of about 0.1-300 minutes.

19. The method of claim 16, wherein said performing said oxidation process comprises performing a ramped oxidation process wherein a temperature of said oxidation process is ramped from a first oxidation temperature between about 1000° C. and about 1150° C. to a final oxidation temperature between about 850° C. and 950° C., wherein a ramp rate of said temperature is in a range of about 0.1 to 600° C./min.

20. The method of claim 16, wherein said region having said second germanium concentration extends throughout an entire width of said exposed silicon/germanium material.

21. The method of claim 16, wherein said region having said second germanium concentration has a thickness that is less than an entire width of said silicon/germanium material.

22. The method of claim 16, further comprising, prior to said performing said oxidation process, forming a liner insulating layer that covers said upper surface and side surfaces of said silicon/germanium material.

23. The method of claim 16, wherein, after said performing said oxidation process and prior to said performing said at least one etching process to remove said oxides, the method further comprises forming a post-oxidation insulating layer on said oxidized upper and side surfaces and on said insulating material in said plurality of said trenches.

24. The method of claim 23, wherein portions of said post-oxidation insulating layer positioned in a bottom of said plurality of said trenches have a thickness of about 5-50 nm.

25. The method of claim 23, further comprising performing a chemical mechanical polishing process after said forming said post-oxidation insulating layer and before said performing said at least one etching process to remove said oxides.

26. A method, comprising:
   forming a fin in an insulating material, said fin being comprised of a silicon/germanium material with a first germanium concentration;
   recessing an upper surface of said insulating material so as to expose an upper portion of said silicon/germanium material above said recessed upper surface of said insulating material, said upper portion having an upper surface and side surfaces;
   performing a deposition process to form a conformal liner insulating layer that entirely covers said upper surface and side surfaces of said silicon/germanium material and said upper surface of said insulating material;
   performing an oxidation process in the presence of said conformal liner insulating layer so as to oxidize said upper and side surfaces of said silicon/germanium material and to form a region in said silicon/germanium material having a second germanium concentration that is greater than said first germanium concentration, wherein said oxidation process is performed at a temperature that falls within a range of about 850-1200° C.

for a duration of about 0.1-720 minutes, and wherein said region having said second germanium concentration extends throughout an entire width of said silicon/germanium material positioned above said recessed upper surface of said insulating material;

performing at least one etching process to remove oxides formed on said upper and side surfaces during said oxidation process so as to expose said region having said second germanium concentration; and forming a gate structure that is positioned around at least said region having said second germanium concentration.

27. A method, comprising:

forming a fin in an insulating material, said fin being comprised of a silicon/germanium material with a first germanium concentration;

recessing an upper surface of said insulating material so as to expose an upper portion of said silicon/germanium material above said recessed upper surface of said insulating material, said upper portion having an upper surface and side surfaces;

performing a deposition process to form a conformal liner insulating layer that entirely covers said upper surface and side surfaces of said silicon/germanium material and said upper surface of said insulating material;

performing an oxidation process in the presence of said conformal liner insulating layer so as to oxidize said upper and side surfaces of said silicon/germanium material and to form a region in said silicon/germanium material having a second germanium concentration that is greater than said first germanium concentration, wherein said oxidation process is performed at a temperature that falls within a range of about 800-1150° C. for a duration of about 0.1-600 minutes, and wherein said region having said second germanium concentration has a thickness that is less than an entire width of said silicon/germanium material;

performing at least one etching process to remove oxides formed on said upper and side surfaces during said oxidation process so as to expose said region having said second germanium concentration; and forming a gate structure that is positioned around at least said region having said second germanium concentration.

28. The method of claim 1, wherein forming said fin in said insulating material comprises forming said fin in a cavity in said insulating material.

29. The method of claim 28, wherein forming said fin in said cavity in said insulating material comprises use of an epitaxial process.

30. The method of claim 26, wherein forming said fin in said insulating material comprises forming said fin in a cavity in said insulating material.

31. The method of claim 30, wherein forming said fin in said cavity in said insulating material comprises use of an epitaxial process.

32. The method of claim 27, wherein forming said fin in said insulating material comprises forming said fin in a cavity in said insulating material.

33. The method of claim 32, wherein forming said fin in said cavity in said insulating material comprises use of an epitaxial process.

* * * * *